(12) United States Patent
Miyasaka

(10) Patent No.: US 7,208,961 B2
(45) Date of Patent: Apr. 24, 2007

(54) ELECTROSTATIC CAPACITANCE DETECTION DEVICE

(75) Inventor: Mitsutoshi Miyasaka, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/208,585

(22) Filed: Aug. 23, 2005

(65) Prior Publication Data

US 2006/0076963 A1    Apr. 13, 2006

(30) Foreign Application Priority Data

Oct. 12, 2004    (JP)    .............................. 2004-298019

(51) Int. Cl.
    G01R 27/26    (2006.01)
(52) U.S. Cl. ...................... 324/686; 324/658; 324/661; 324/688
(58) Field of Classification Search ................ 324/649, 324/658–690; 382/124; 257/414
    See application file for complete search history.

(56) References Cited

U.S. PATENT DOCUMENTS

| | | | | |
|---|---|---|---|---|
| 4,771,638 A | * | 9/1988 | Sugiyama et al. | 73/721 |
| 4,908,921 A | * | 3/1990 | Chen et al. | 29/25.41 |
| 6,264,302 B1 | * | 7/2001 | Imanaka et al. | 347/19 |
| 6,518,083 B2 | * | 2/2003 | Sato et al. | 438/50 |
| 6,657,269 B2 | * | 12/2003 | Migliorato et al. | 257/414 |
| 6,844,744 B2 | * | 1/2005 | Ishii et al. | 324/686 |
| 2003/0222659 A1 | * | 12/2003 | Miyasaka | 324/661 |
| 2004/0103937 A1 | * | 6/2004 | Bilyalov et al. | 136/255 |
| 2004/0239342 A1 | * | 12/2004 | Yoshida et al. | 324/663 |
| 2005/0078856 A1 | * | 4/2005 | Miyasaka et al. | 382/124 |

FOREIGN PATENT DOCUMENTS

| | | |
|---|---|---|
| JP | 11-118415 | 4/1999 |
| JP | 2000-346608 | 12/2000 |
| JP | 2000-346610 | 12/2000 |
| JP | 2001-56204 | 2/2001 |
| JP | 2001-133213 | 5/2001 |
| JP | 2003-254706 | 9/2003 |

OTHER PUBLICATIONS

Patent Abstracts of Japan, Publication No. 11-118415, publication date Apr. 30, 1999, 2 pp.

(Continued)

*Primary Examiner*—Andrew H. Hirshfeld
*Assistant Examiner*—Hoai-An D. Nguyen
(74) *Attorney, Agent, or Firm*—Harness, Dickey & Pierce, P.L.C.

(57) ABSTRACT

An electrostatic capacitance detection device includes an electrostatic capacitance detection element arranged in M rows and N columns. The electrostatic capacitance detection element includes a signal detection element that retains a charge in proportion to the electrostatic capacitance. The signal detection element includes a capacitance detection electrode and a capacitance detection dielectric layer formed on the capacitance detection electrode. The capacitance detection dielectric layer includes a first semiconductor layer and an insulator disposed between the capacitance detection electrode and the first semiconductor layer. A signal amplification element amplifies a signal corresponding to the retained charge in the signal detection element. The signal amplification element includes a second semiconductor layer different from the first semiconductor layer. A power supply line supplies a power source to the electrostatic capacitance detection element.

12 Claims, 5 Drawing Sheets

OTHER PUBLICATIONS

Patent Abstracts of Japan, Publication No. 2000-346608, publication date Dec. 15, 2000, 2 pp.
Patent Abstracts of Japan, Publication No. 2000-346610, publication date Dec. 15, 2000, 2 pp.
Patent Abstracts of Japan, Publication No. 2001-056204, publication date Feb. 27, 2001, 1 page.
Patent Abstracts of Japan, Publication No. 2001-133213, publication date May 18, 2001, 2 pp.
Patent Abstracts of Japan, Publication No. 2003-254706, publication date Sep. 10, 2003, 1 page.

* cited by examiner

ELECTROSTATIC CAPACITANCE DETECTION DEVICE

RELATED APPLICATION INFORMATION

This application claims priority to Japanese Patent Application No. 2004-298019, filed Oct. 12, 2004, whose contents are expressly incorporated herein by reference.

BACKGROUND OF THE INVENTION

1. Technical Field

The present invention relates to an electrostatic capacitance detection device that reads the surface contours of a fingerprint or other target object having extremely small ridges and valleys by detecting electrostatic capacitance, which changes according to the distance from the surface of the target object.

2. Related Art

Conventionally, electrostatic capacitance detection devices used for fingerprint sensors, etc., are fabricated so that a sensor electrode and a protective film such as a dielectric provided on the sensor electrode are formed on a substrate as described in examples of related art listed as follows: Japanese Unexamined Patent Publication No. 2000-346610 is a first example of related art; Japanese Unexamined Patent Publication No. 2003-254706 is a second example of related art; Japanese Unexamined Patent Publication No. 11-118415 is a third example of related art; Japanese Unexamined Patent Publication No. 2000-346608 is a fourth example of related art; Japanese Unexamined Patent Publication No. 2001-56204 is a fifth example of related art; and Japanese Unexamined Patent Publication No. 2001-133213 is a sixth example of related art.

Here, in the electrostatic capacitance detection device, the thickness of dielectric layer cannot be increased from electrostatic capacitance detection point of view. In addition, a target object to be detected is usually charged. When the target object having a charge, it often causes a breakdown of a peripheral circuit due to an instantaneous current induced by a discharge.

In order to avoid the breakdown due to the instantaneous current, for example, the first example of related art describes the following manner: a sensing electrode is formed in a layer different from the layer in which a conversion circuit and wirings are formed; the sensing electrode is disposed at a location adjacent to the target object; and the conversion circuit and wirings are disposed as a lower layer of insulator, the sensing electrode, and the protective film. Also, in order to prevent a sensor from a breakdown, the second example of related art describes a configuration in which a conductor or cover, which the target object comes in contact with before contacting the sensor, is provided so as to flow a charge to a power supply (refer to its paragraphs 0077 to 0081).

As above-mentioned, since the thickness of the dielectric layer cannot be increased, the dielectric layer is often broken due to worn off by rubbing with fingers, etc. In a case where a huge amount of charge is charged, even though the first example of related art in which the sensing electrode is separated from the layer in which the conversion circuit and the wiring are formed, some instantaneous current often flows as long as they are electrically connected. As a result, it is not enough for protective measures.

Also, the second example of related art, in which the conductor or caver is provided so that the target object is contacted before contacting the sensor, needs to form additional components. The components for discharge, which are used for fingerprint sensor to which large pressing force is applied, are affected by the force to easily be broken. Once a part of the components for discharge is broken, the instantaneous current flows directly into the wiring and peripheral circuits, resulting in the breakdown of the peripheral circuits. Accordingly, it is not always preferable that charges generated in the target object are discharged by depending on an electrode arrangement or components for discharge.

SUMMARY

An advantage of the invention is to provide an electrostatic capacitance detection device that can assuredly protect a circuit from an instantaneous current with a simple structure without occurring any breakages, etc.

An electrostatic capacitance detection device that reads surface contours of a target object by detecting an electrostatic capacitance, which changes according to a distance from the target object, according to an aspect of the invention includes an electrostatic capacitance detection element arranged in a matrix of M rows and N columns, and a power supply line that supplies a power source to the electrostatic capacitance detection element. The electrostatic capacitance detection element includes a signal detection element storing a charge corresponding to the electrostatic capacitance and a signal amplification element amplifying a signal corresponding to the charge stored by the signal detection element. The signal detection element includes a capacitance detection electrode and a capacitance detection dielectric layer disposed on a side that the target object comes in contact with of the capacitance detection electrode. Particularly, the capacitance detection dielectric layer includes an insulator and a semiconductor layer.

According to the configuration, upon approaching of the target object such as fingerprint, etc., to the electrostatic capacitance detection element, a voltage corresponding to whether the target object is contacted or not is produced in the capacitance detection electrode. The voltage is amplified by the signal amplification element so that electrostatic capacitance detection is conducted corresponding to whether ridges in a fingerprint, etc are contacted or not. Since the dielectric constant of the semiconductor layer is larger than that of the insulator, the thickness of the capacitance detection dielectric layer can be increased, improving durability. Here, in a case where the target object is charged, if the charge is not released via a path, an instantaneous current flows from the capacitance detection electrode to a peripheral circuit upon approaching of the target object, causing a circuit breakdown due to an electrostatic discharge. On this point, according to the configuration, the charge of the target object does not flow directly via the capacitance detection electrode since the insulator is provided to the capacitance detection dielectric layer. In addition, according to the configuration, since the semiconductor layer is provided, an inversion layer is formed on the surface of the semiconductor layer just before the target object contacts the semiconductor layer, so that charges of the target object quickly spreads over the surface of the semiconductor layer. As a result, circuits can be prevented from a breakdown due to the electrostatic discharge.

Here, it is preferable that the semiconductor layer is disposed on the uppermost surface of the electrostatic capacitance detection element. This configuration allows the inversion layer to be formed in the semiconductor layer before the target object is contacted, so that the charge is released. Moreover, even if the target object contacts the capacitance detection dielectric layer, the instantaneous current does not flow directly to the circuit since the insulator is further formed between the semiconductor layer and the capacitance detection electrode. As a result, the circuit can be prevented from the breakdown due to the electrostatic discharge.

Here, an electrical resistance RPP of the semiconductor layer is represented by the following equation:

$$R_{PP} > \frac{10 \cdot \Delta\tau}{C_A} \quad \text{Equation 1}$$

where $\Delta\tau$ is measurement time of the electrostatic capacitance detection element, and CA is a target object electrostatic capacitance.

With such condition, the charge amount of the target object to be measured that flows to an adjacent capacitance detection electrode can be reduced approximately 10% below. The breakdown due to the electrostatic discharge can be prevented without dropping measurement accuracy of the electrostatic capacitance detection device.

In addition, a specific resistance $\rho D$ of the semiconductor layer preferably satisfies the following equation:

$$\rho_D > \frac{\alpha}{1-\alpha} \cdot t_D \cdot \frac{10 \cdot \Delta\tau}{C_A} \quad \text{Equation 2}$$

where $\Delta\tau$ is the measurement time of the electrostatic capacitance detection element, CA is the target object electrostatic capacitance, tD is the thickness of the semiconductor layer, and $\alpha=y/x$. Here, x is a pitch of the capacitance detection electrode, and y is the width of the capacitance detection electrode.

With such condition, the charge amount of the target object to be measured that flows to an adjacent capacitance detection electrode can be reduced approximately 10% below. The breakdown due to the electrostatic discharge can be prevented without dropping measurement accuracy of the electrostatic capacitance detection device.

In addition, an impurity concentration n of the semiconductor layer preferably satisfies the following equation:

$$n < \frac{1-\alpha}{\alpha} \cdot \frac{C_A}{10 \cdot \Delta\tau} \cdot \frac{1}{q\mu t_D} \quad \text{Equation 3}$$

where $\Delta\tau$ is the measurement time of the electrostatic capacitance detection element, CA is the target object electrostatic capacitance, tD is the thickness of the semiconductor layer, q is a carrier charge amount of the semiconductor layer, $\mu$ is carrier mobility of the semiconductor layer, and $\alpha=y/x$. Here, x is the pitch of the capacitance detection electrode, and y is the width of the capacitance detection electrode.

By limiting a dose amount of the semiconductor layer so as to satisfy such condition, the charge amount of the target object to be measured that flows to an adjacent capacitance detection electrode can be reduced approximately 10% below. The breakdown due to the electrostatic discharge can be prevented without dropping measurement accuracy of the electrostatic capacitance detection device.

Here, it is preferable that the semiconductor layer is amorphous silicon. The amorphous silicon is relatively inexpensive and widely used. It is economical as a material for the semiconductor layer and easily procured. In addition, amorphous, i.e. silicon in amorphous state has a large dielectric ratio of 11.9. High capacitance can be retained even though the film is formed thick. This high capacitance makes it possible to form thicker film while keeping the target object capacitance high. Therefore, high durability can be achieved that is suitable for the capacitance detection dielectric layer used for fingerprint sensors to which high pressing force is applied.

Moreover, the amorphous silicon is substantially intrinsic due to the following reasons. The intrinsic amorphous silicon has a value suitable for the carrier concentration required for the semiconductor layer as above-mentioned. By using the intrinsic amorphous silicon, the electrostatic capacitance detection device having high accuracy can be provided.

For example, it is preferable that the amorphous silicon has the carrier concentration of $4\times10^{10}$ cm$^{-3}$ and below. In a typical electrostatic capacitance detection device such as fingerprint sensor, etc., this value is the upper limit value of the carrier concentration in order to be able to maintain measurement accuracy high.

The insulator that composes a part of the capacitance detection dielectric layer is, for example, silicon nitride. Using the silicon nitride, not only the target object capacitance can be maintained high with a certain degree of dielectric constant, but also excellent durability can be achieved.

The aspect of the invention further includes a reference capacitor connected to the electrostatic capacitance detection element. It is preferable that an element capacitance CD of the signal detection element is sufficiently larger than the sum of a reference capacitor capacitance CR and an element capacitance CT of the signal amplification element, i.e. CR+CT. The reference capacitor capacitance CR and the transistor capacitance CT of the signal amplification element are defined by the following equations:

$$C_R = \epsilon_0 \cdot \epsilon_R \cdot S_R / t_R; \text{ and}$$

$$C_T = \epsilon_0 \cdot \epsilon_{0x} \cdot S_T / t_{0x}$$

where SR is the area of the reference capacitor electrode, tR is the thickness of the reference capacitor dielectric layer, $\epsilon R$ is a relative dielectric constant of the reference capacitor dielectric layer, ST is the area of a gate electrode of the signal amplification element, tox is the thickness of a gate insulator of the signal amplification element, $\epsilon$ox is a relative dielectric constant of the gate insulator of the signal amplification element, and $\epsilon 0$ is the permittivity in vacuum.

In addition, the element capacitance CD of the signal detection element is defined by the following equation:

$$C_D^{-1} = (\epsilon_0 \cdot \epsilon_{DI} \cdot S_D / t_{DI})^{-1} + (\epsilon_0 \cdot \epsilon_{DS} \cdot S_D / t_{DS})^{-1}$$

where SD is the area of the capacitance detection electrode, tDI is the thickness of the insulator of the capacitance detection dielectric layer, tDS is the thickness of the semiconductor layer of the capacitance detection dielectric layer, $\epsilon$DI is a relative dielectric constant of the insulator of the capacitance detection dielectric layer, $\epsilon$DS is a relative dielectric constant of the semiconductor layer of the capacitance detection dielectric layer, and $\epsilon 0$ is the permittivity in vacuum. With these conditions, the electrostatic capacitance detection device having high measurement accuracy can be achieved.

In addition, in the aspect of the invention it is preferable that the target object is not in contact with but is separated from the semiconductor layer by a target object distance tA and the reference capacitor capacitance CR is sufficiently larger than the target object capacitance CA, when the target object capacitance CA is defined as the following equation:

$$C_A = \epsilon_0 \cdot \epsilon_A \cdot S_D / t_A$$

where $\epsilon_0$ is the permittivity in vacuum, $\epsilon_A$ is the dielectric constant of air, and S D is the area of the capacitance detection electrode. With these conditions, the electrostatic capacitance detection device having high measurement accuracy can be achieved.

In addition, in the aspect of the invention it is preferable that the target object is not in contact with but is separated from the capacitance detecting dielectric layer by the target object distance tA and the reference capacitor capacitance CR is sufficiently larger than the target object capacitance CA, when the target object capacitance CA is defined as the following equation:

$$C_A = \epsilon_0 \cdot \epsilon_A \cdot S_D / t_A$$

where $\epsilon_0$ is the permittivity in vacuum, $\epsilon_A$ is the dielectric constant of air, and S D is the area of the capacitance detection electrode. With these conditions, the electrostatic capacitance detection device having high measurement accuracy can be achieved.

An electronic apparatus according to another aspect of the invention is equipped with the above-mentioned electrostatic capacitance detection device. "Electronic apparatus" includes all devices that need electrostatic capacitance detection. Portability is not essentially required. For example, a fingerprint sensor built into a wall is also referred to as "electronic apparatus" according to another aspect of the invention.

According to the aspects of the invention, since the insulator and the semiconductor layer are disposed at a side, which the target object comes in contact with, of the capacitance detection electrode, the charge of the target object can be effectively discharged without flowing the instantaneous current via the capacitance detection electrode. As a result, the electrostatic capacitance detection device can be assuredly prevented from the breakdown due to the electrostatic discharge without using sophisticated components for discharge.

BRIEF DESCRIPTION OF THE DRAWINGS

The invention will be described with reference to the accompanying drawings, wherein like numbers refer to like elements, and wherein.

DESCRIPTION OF THE EMBODIMENTS

Embodiments of the invention will now be described with reference to the accompanying drawings.

In the embodiments according to the invention, an electrostatic capacitance detection device that reads the surface contours of a target object by detecting electrostatic capacitance that changes according to the distance from a target object, is applied to a fingerprint sensor for detecting fingerprints. In the embodiments described below, "target object" is a finger and surface contours to be detected are fingerprints.

First, an operation principle of an electrostatic capacitance detection device of the invention will be described. Since they are ordinarily fabricated on inexpensive glass substrates, thin film semiconductor devices are generally known for their usefulness in inexpensively fabricating semiconductor integrated circuits that require a large area. Specifically, nowadays, they are used for devices such as liquid crystal display devices, etc. Therefore, fabricating thin film semiconductor devices for use as an electrostatic capacitance detection device in a fingerprint sensor, for example, obviates the need to use an expensive substrate such as a single-crystal silicon wafer, whose production consumes tremendous energy. Instead, the device can be fabricated inexpensively on glass without wasting precious global resources. In addition, the thin film semiconductor devices can fabricate semiconductor integrated circuits on a plastic substrate by applying transfer technology. Therefore, such electrostatic capacitance detection devices do not have to be produced on a single-crystal silicon wafer but can also formed on a plastic substrate.

However, it is impossible to fabricate an electrostatic capacitance detection device that directly outputs an output of a capacitance detection electrode that detects an electrostatic capacitance with thin film semiconductor devices even though using current thin film semiconductor device technology. Since a charge Q induced by contacting fingerprints, etc., is extremely small, the charge Q cannot be accurately read with a thin film semiconductor device. This is because the transistor characteristics in a thin film semiconductor are not as good as the transistor characteristics obtained with single-crystal silicon LSI technology, and, moreover, because of a large degree of deviation in characteristics between thin film semiconductor devices.

Figure 5:
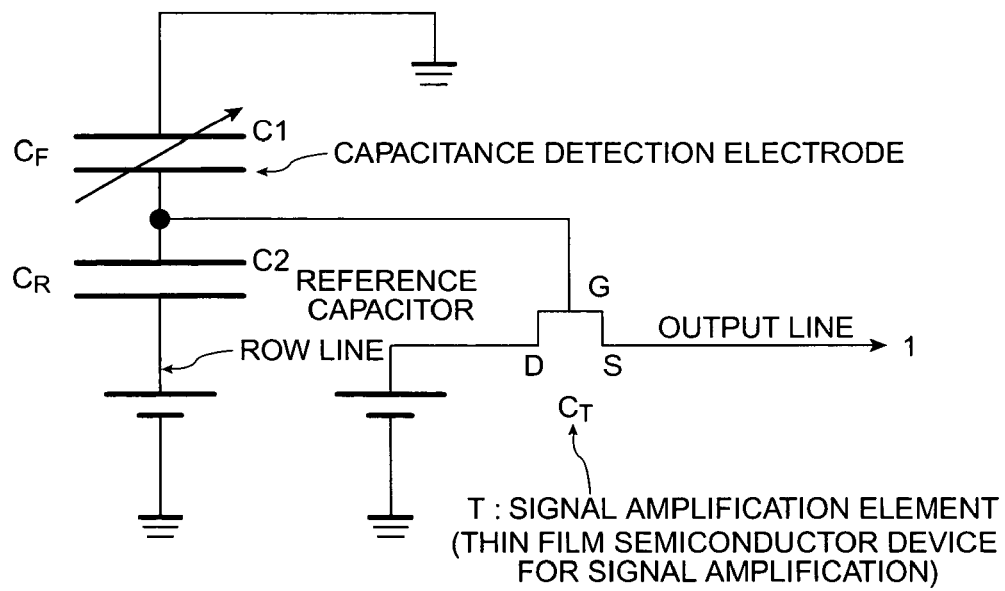
FIG. 5 is an explanatory diagram illustrating a principle of the embodiment of the invention.

FIG. 5 illustrates an equivalent circuit of the electrostatic capacitance detection device of the invention when it is in a detection mode. An electrostatic capacitance detection element of the invention includes a capacitance detection electrode C1 and a reference capacitor C2, and a signal amplification element T that amplifies a detection voltage VG corresponding to the induced charge Q. Upon contacting of fingerprints, etc., the capacitance detection electrode C1 has an electrostatic capacitance CF, while the reference capacitor C2 has an electrostatic capacitance CR. A signal amplification element T is composed of a thin film semiconductor device for signal amplification including a source electrode S, a drain electrode D, and a gate electrode G. The gate electrode G and the capacitance detection electrode C1 are connected. The electrostatic capacitance detection element includes the reference capacitor C2. One electrode of the reference capacitor C2 is connected to a row line, while the other electrode is connected to the capacitance detection electrode C1 and the gate electrode G of the signal amplification element T.

In the specification, a source electrode and a drain electrode of a semiconductor device are not differentiated. However, expediently, one electrode is referred to as a source electrode, while the other electrode is referred to as a drain electrode. If they are aimed at perfection in physical point of view, the source electrode is defined as one having lower potential in a N-type transistor, while one having higher potential in a P-type transistor. However, the electrode having higher potential in both electrodes are changed in accordance with an operation status. Accordingly, the source electrode and the drain electrode in a transistor are interchangeable in a precise sense. In the specification, such strictness is excluded for simple description. Expediently, one electrode is referred to as the source electrode, while the other is referred to as the drain electrode.

In the above-mentioned configuration, upon approaching or contacting of a target object such as a fingerprint, etc., to the capacitance detection electrode C1, the potential VG is produced in the capacitance detection electrode C1 in response to an electrostatic capacitance CF with respect to the target object. The potential VG is a voltage induced between a capacitor of the capacitance detection electrode C1 having the electrostatic capacitance CF that changes in response to surface contours (a fingerprint) of the target object and a combined capacitance CR+CT of the reference capacitor C2 having the electrostatic capacitance CR and the signal amplification element T having a transistor capacitance CT. The potential VG is input to the gate electrode G so as to change a gate potential of the thin film semiconductor device. If a predetermined voltage is applied to the drain electrode D of the thin film semiconductor device, a current Ids that flows between the source and the drain of the signal amplification element T in proportion to the induced voltage VG is markedly amplified. The charge Q is produced in the gate electrode, etc., in accordance with the potential VG. The charge Q is retained without flowing to anywhere. As a result, the current Ids is kept a constant value. Accordingly, the current Ids is readily measured by increasing the drain voltage or extending measurement time. Consequently, the surface contours can be accurately measured even though using thin film semiconductor devices. A signal (current or voltage) that amplifies electrostatic capacitance information of the target object is read via an output line.

In order to measure the electrostatic capacitance of the target object, the current Ids via the signal amplification element T, or the voltage that changes in proportion to the current Ids may be measured. In a case where the reference capacitor C2 is not provided, the electrostatic capacitance detection device operates on the same principle as that described above by using the electrostatic capacitance CF that changes in response to the surface contours of the target object, the transistor capacitance CT, and the electrostatic capacitance CR that is set as zero. Below, an example in which the reference capacitor is provided will be described as an embodiment of the invention. However, the invention can be applied to a case where the transistor capacitance of the signal amplification element is commonly used as the reference capacitor without providing the reference capacitor.

The operation principle of the electrostatic capacitance detection device according to the invention is outlined as above. Particularly, the invention relates to improvement on a capacitance detection dielectric layer provided to the capacitance detection electrode C1. It now will be described below.

Figure 1:
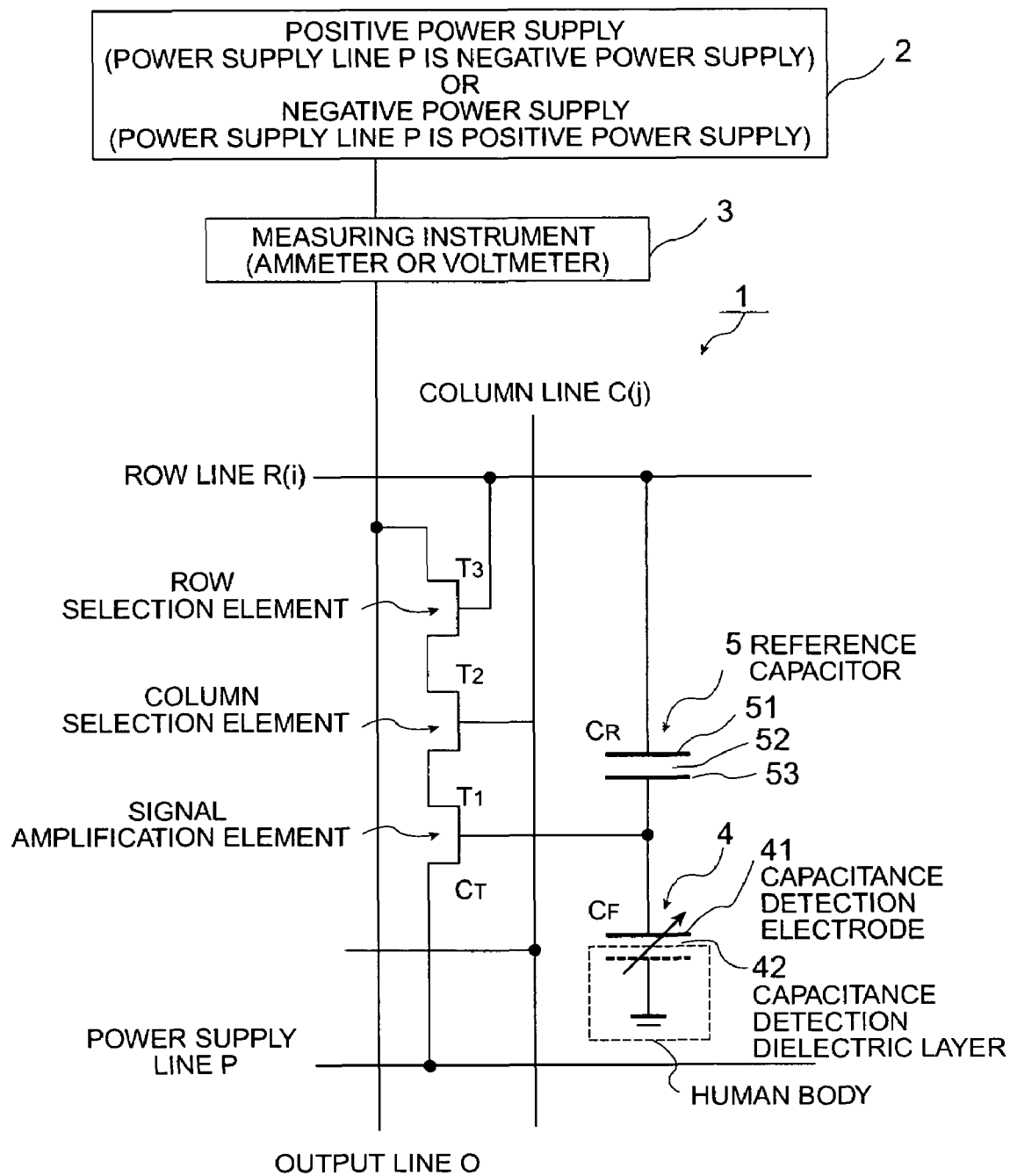
FIG. 1 is a diagram illustrating a circuit configuration of an electrostatic capacitance detection element according to an embodiment of the invention.

FIG. 1 illustrates a circuit configuration of an electrostatic capacitance detection element that embodies the invention. FIG. 1 is a block diagram of one element among the electrostatic capacitance detection elements arranged in a matrix of M (M is an integer of one or more) rows and N (N is an integer of one or more) columns. It illustrates a connection relation of an electrostatic capacitance detection element 1.

As shown in FIG. 1, the electrostatic capacitance detection device of the invention includes M number of row lines R(i) ($1 \leq i \leq M$) and N number of column lines C(j) ($1 \leq j \leq N$) both of which are arranged in a matrix of M rows and N columns, the electrostatic capacitance detection element 1 provided at the intersection of M×N number formed by intersecting each row line and each column line, and a power supply line P supplying power source to each electrostatic capacitance detection element 1. The electrostatic capacitance detection element 1 includes a signal detection element 4 that retains a charge in proportion to an electrostatic capacitance, and a signal amplification element T1 that amplifies a signal in accordance with the retained charge in the signal detection element 4. In addition, the signal detection element 4 includes a capacitance detection electrode 41, and a capacitance detection dielectric layer 42 provided at a side that the target object comes in contact with. Particularly, the capacitance detection dielectric layer 42 is featured by including an insulator 160 and a semiconductor layer 162 (refer to FIG. 2). Details will be described later.

A reference capacitor 5 is connected between the capacitance detection electrode 41 and the row line R(i). The reference capacitor 5 is composed of a first electrode 51 of the reference capacitor, a reference capacitor dielectric layer 52, and a second electrode 53 of the reference capacitor. The gate electrode of the signal amplification element T1, the capacitance detection electrode 41, and one electrode (the second electrode 53) of the reference capacitor 5 are connected.

The signal amplification element T1 is disposed between the power supply line P and the output line O. In the embodiment, the source electrode of the thin film semiconductor device for signal amplification serving as the signal amplification element T1 is electrically connected to the power supply line P, while the drain electrode thereof is electrically connected to the output line O via a column selection element T2 and a row selection element T3 both of which are the thin film semiconductor device. In a case where the electrostatic capacitance detection element 1 includes the column selection element T2 and the row selection element T3 such as the embodiment, the gate electrode of the thin film semiconductor device for column selection is connected to the column line C(i), while the gate electrode of the thin film semiconductor device for row selection is connected to the row line R(j). In the embodiment, since a N-type transistor is used for the row selection element T3, low potential (Vss) is applied to an unselected row line, while high potential (Vdd) is applied to the selected row line R (e.g. the i-th row line). Similarly, in the embodiment, since a N-type transistor is used for the column selection element T2, low potential (Vss) is applied to an unselected column line C, while high potential (Vdd) is applied to the selected column line C (e.g. the j-th column line). The selected column line C(j) causes the column selection element T2 to produce a conductive state between the source and drain thereof. The selected row line R(i)

causes the row selection element T3 to produce a conductive state between the source and drain thereof.

Alternatively, a P-type transistor may be used for the column selection element T2. In this case, high potential (Vdd) is applied to the gate electrode of the P-type transistor for unselecting, whereas low potential (Vss) is applied for selection. Similarly, a P-type transistor may be used for the row selection element T3. In this case, high potential (Vdd) is applied to the gate electrode of the P-type transistor for unselecting, whereas low potential (Vss) is applied for selection.

Here, the word of "electrically connected" means a state in which electrical conduction can be achieved via a switching element, etc. Of course, the drain electrode may be directly connected to the output line, while the source electrode may be directly connected to the power supply line.

In addition, a reset switch composed of the thin film semiconductor device may be connected to a connection point of the capacitance detection electrode 41 and the reference capacitor 5. For example, a source electrode of the thin film semiconductor device included in the reset element is connected to the connection point, a drain electrode thereof is connected to the ground potential, and a gate electrode thereof is connected to an adjacent column line, etc. According to the configuration, upon selecting the reset switch to be a switched-on state, the gate electrode of the signal amplification element T1, the second electrode 53 of the reference capacitor, and the capacitance detection electrode 41 are electrically connected to the ground potential. Accordingly, unwanted charges are eliminated from the gate electrode of the signal amplification element T1 and the capacitance detection electrode 41 before measuring an electrostatic capacitance of the target object by selecting the electrostatic capacitance detection element 1, which significantly improving detection accuracy.

According to the configuration of the embodiment, the surface contours of the target object can be read as a whole by sequentially selecting the column line C(j) and the row line R(i) so that each electrostatic capacitance detection element 1 arranged in a matrix sequentially becomes a selected-state. Specifically, in the embodiment, the electrostatic capacitance detection element 1 is configured so that the column selection element T2 and the row selection element T3 are included, while the column selection element T2 and the row selection element T3 are connected in series. By providing the column selection element T2, the column is uniquely selected, preventing information interference between columns. Likewise, by including the row selection element T3, the row is uniquely selected, preventing information interference between rows. As a result, the electrostatic capacitance detection element 1 can uniquely be selected.

In the configuration, upon selecting one row line R (e.g. the i-th row line), all of the row selection element T3 connected to the row line R(i) concurrently become a transistor-on state. In the state, upon selecting a given column line C (e.g. the j-th column line), high potential (Vdd) is only applied to the column line C(j) in a case where the column line C(j) is selected from the M number of column lines C. As a result, electric conductivity of the column selection element T2 connected to the column line C(j) is increased so as to be the transistor-on state. Consequently, electric conductivity between the power supply line P and the output line O is determined by the signal amplification element T1.

Here, the electrode 51 of the reference capacitor 5 is connected to the row line R(i) that is in a selected-state. Therefore, high potential is applied to the reference capacitor 5, so that potential is applied to the gate electrode of the signal amplification element T1 in accordance with an electrostatic capacitance of the target object. Only the electrostatic capacitance detection element 1 located at the intersection of the row line R(i) and the column line C(j) both of which are selected as above-mentioned, i.e. the electrostatic capacitance detection element located at I row, j column, is selected from the electrostatic capacitance detection element 1 of M×N number. As a result, the electrostatic capacitance at the location of the target object is measured.

Since the electrostatic capacitance detection element 1 is selected one by one in the embodiment, various configurations of the power supply line P and the output line O can be employed. For example, the power supply line P provided in the electrostatic capacitance device can be arranged in the column direction by N number the same number of column lines C, and also can be arranged in the row direction by M number the same number of row lines R. Further, one power supply line can be provided every two columns, or every two rows. In addition, the output line O provided in the electrostatic capacitance device can be arranged in the column direction by N number the same number of column lines C, and also can be arranged in the row direction by M number the same number of row lines R. Further, one output line can be provided every two columns, or every two rows. In the example shown in FIG. 1, the power supply line P is arranged in the row direction by M number the same number of row lines R, while the output line O is arranged in the column direction by N number the same number of column lines C.

Next, a structure of the capacitance detection dielectric layer featured in the invention will be described.

Figure 2:
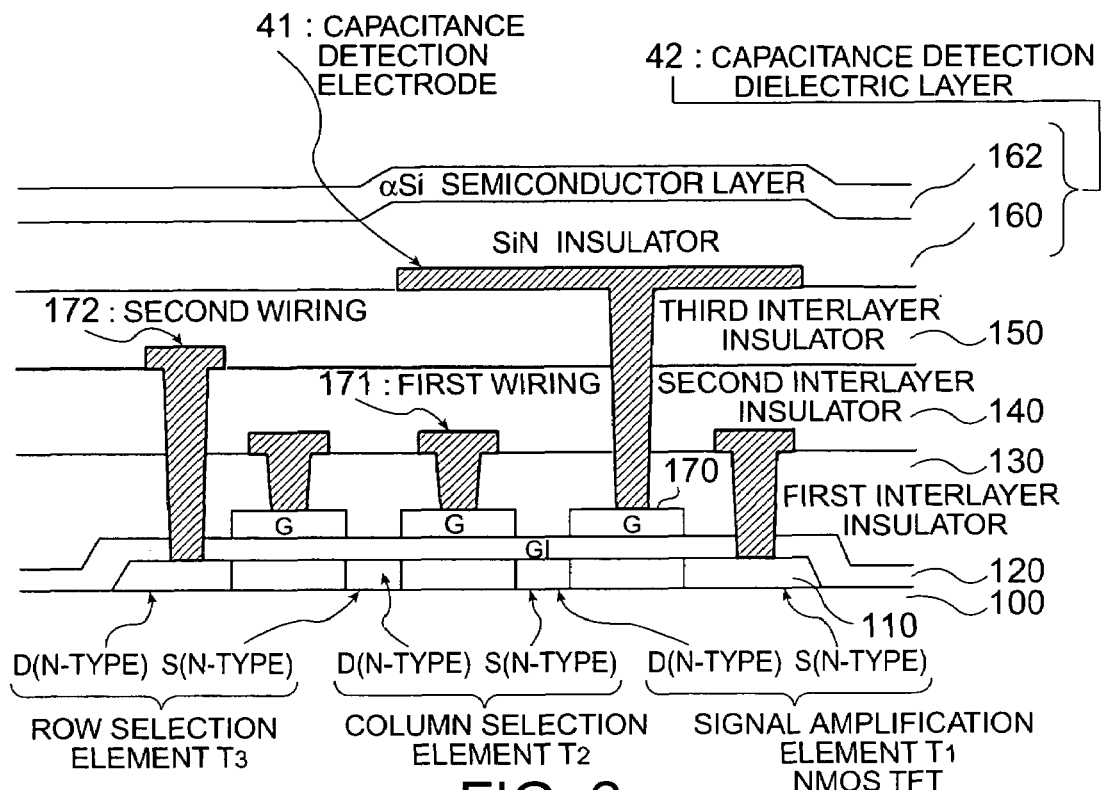
FIG. 2 is an explanatory diagram illustrating a layer structure of the electrostatic capacitance detection element according to the embodiment of the invention.

FIG. 2 is a magnified view illustrating a multilayer structure of the capacitance detection electrode 41 in the electrostatic capacitance detection device of the embodiment.

As shown in FIG. 2, as the multilayer structure in the electrostatic capacitance detection element 1 of the embodiment, a semiconductor layer 110, a gate insulator 120, a first interlayer insulator 130, a second interlayer insulator 140, and a third interlayer insulator 150 are layered on a substrate 100 made of such as plastic. The capacitance detection electrode 41 is formed on the third interlayer insulator 150 by patterning. On the third interlayer insulator 150 and the capacitance detection electrode 41, the capacitance detection dielectric layer 42 featured in the invention is formed. The capacitance detection dielectric layer 42 is composed of an insulator 160 as a lower-layer, and a semiconductor layer 162 as an upper-layer.

The semiconductor layer 110 is the layer in which the thin film semiconductor device is respectively formed so as to serve as the signal amplification element T1, the column selection element T2, and the row selection element T3. In the semiconductor layer 110, impurities are selfalignmently doped using each gate electrode 170 formed on the gate insulator 120 as a mask so as to form a source S and a drain D. On the first interlayer insulator 130 formed on the gate electrode 170, a first wiring 171 corresponding to the power supply line P and the row line R(i) is formed. The first wiring 171 is electrically connected to the source S of the signal amplification element T1, and the gate electrodes 170 of the column selection element T2 and the row selection element T3 via through holes. On the second interlayer insulator 140, a second wiring 172 corresponding to the column line C(j) and the output line O is formed by patterning a metal layer. The second wiring 172 is electrically connected to the drain D of the row selection element T3 via a though hole. On the third interlayer insulator 150, the capacitance detection element 41 is disposed by patterning a metal layer. The capacitance detection element 41 is electrically connected to the gate electrode 170 of the signal amplification element T1 via a though hole.

Each interlayer insulator is formed by depositing SiO2, for example. In the capacitance detection dielectric layer 42, the insulator 160 is formed by a material having excellent insulation characteristics and durability as a protective film, e.g. silicon nitride (SiN). The semiconductor layer 162 is formed so as to have a relatively high dielectric constant and conditions of a resistance value, a carrier concentration, and the thickness as mentioned later.

As a material for such semiconductor layer 162, for example, amorphous silicon is applied. From durability point of view, the semiconductor layer 162 is required to be formed as thicker as possible so as to prevent the film from being worn due to the contact of fingers, etc., and the electrode from being directly strongly affected by pressing force. In contrast, from detection accuracy point of view, the shorter distance between the target object and the capacitance detection electrode, the larger detected capacitance. Therefore, the semiconductor layer 162 is required to be formed as thinner as possible in order to improve detection accuracy. On this point, amorphous silicon can satisfy both a mechanical strength required as a protective film and a high dielectric constant required as the dielectric layer. Because amorphous silicon has a dielectric constant of 11.9, which is relatively large, so that it can keep a detected capacitance large even though it is formed to be thick.

The electrostatic capacitance detection element 1 having such layer structure can be formed on the substrate 100 made of plastic using known transfer technology. On plastic, a fingerprint sensor based on single-crystal silicon technology would promptly break or would have very little practical application, since it would not possess sufficient size. In contrast, the electrostatic capacitance detection element 1 formed on the substrate 100 made of plastic of the embodiment will not break even if the area on the plastic substrate is sufficiently large to cover a fingertip. Hence, the electrostatic capacitance detection element 1 can be used as a fingerprint sensor on the substrate 100 made of plastic.

Figure 3:
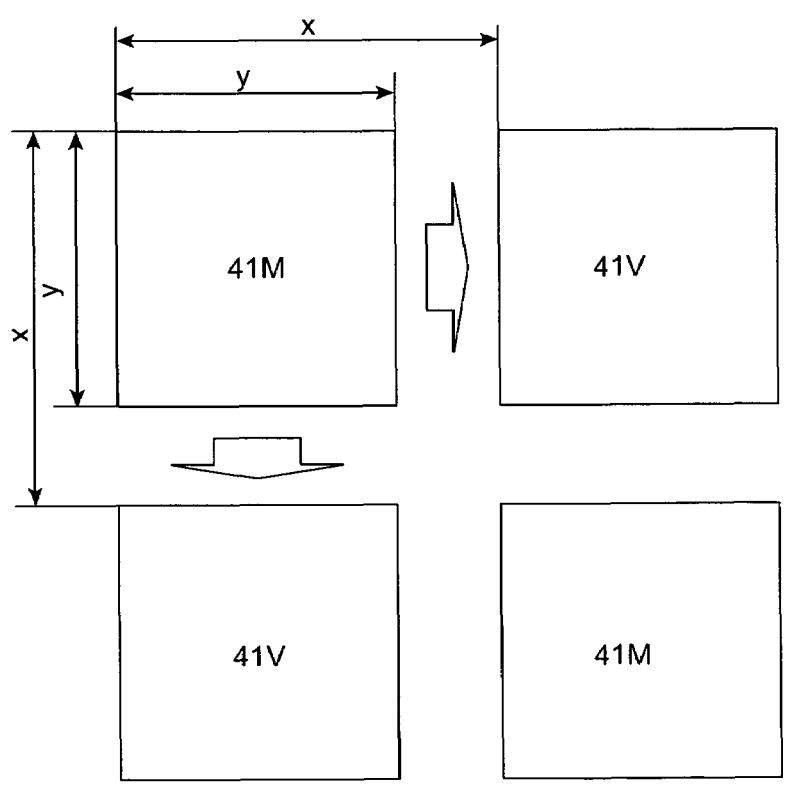
FIG. 3 is a magnified plan view illustrating an electrostatic capacitance detection electrode according to the embodiment of the invention.

FIG. 3 is a magnified plan view illustrating the capacitance detection electrode 41 in the electrostatic capacitance detection device of the embodiment. FIG. 3 is also schematic view magnifying only 4 capacitance detection electrodes 41. In FIG. 3, 41M represents a capacitance detection electrode that a ridge in a fingerprint contacts, while 41V represents a capacitance detection electrode located at a valley in the fingerprint. For the sake of convenience in analysis, it is assumed that the capacitance detection electrode 41 has a pitch between electrodes of x over the whole electrostatic capacitance detection device, and is formed by a planar square of y (<x) on a side as the electrode size. The planar shape of each capacitance detection electrode 41 can be formed in any shapes such as a rectangle, a polygon, a circle, an oval, etc., in addition to the square shown in FIG. 3.

Figure 4:
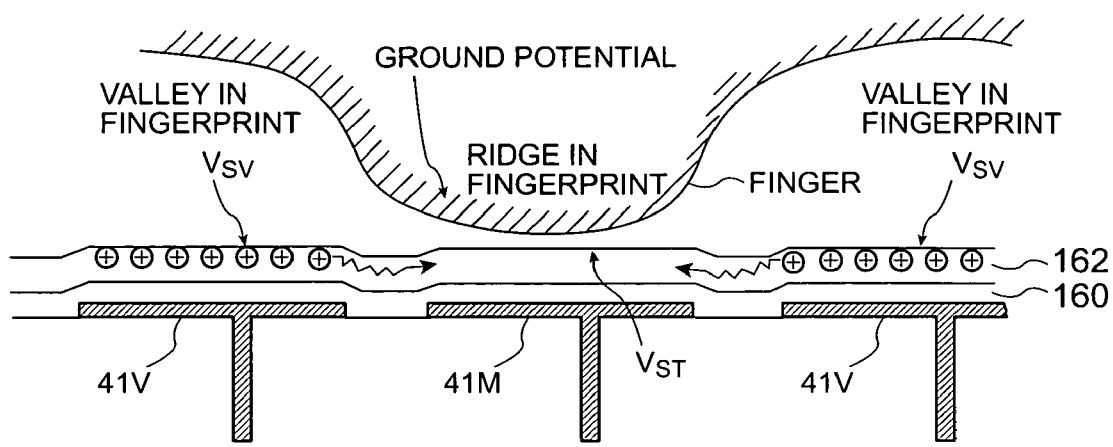
FIG. 4 is an explanatory diagram illustrating a mechanism of the invention.

With reference to FIG. 4, effects of the electrostatic capacitance detection dielectric layer according to the invention will be described. FIG. 4 illustrates a condition in which a fingertip as the target object approaches so that the ridges of a fingerprint come close to the capacitance detection electrode 41M, while the valleys of the fingerprint come close to the capacitance detection electrode 41V.

In a conventional capacitance detection dielectric layer, a dielectric layer (insulator) having a given dielectric constant is deposited on an electrode. Here, the target object such as fingers is often charged. Even more in time particularly such as winter in which humidity is low and electro discharge easily occurs. Approaching the charged target object to the electrostatic capacitance detection device causes a problem in that a charge stored in the surface of the charged fingertip is discharged through the dielectric layer so as to instantly flow a large current from the capacitance detection electrode to a peripheral circuit, resulting in a circuit breakdown due to an electrostatic discharge.

On this point, the capacitance detection dielectric layer 42 of the embodiment has a double structure composed of the insulator 160 and the semiconductor layer 162 as shown in FIG. 2. The semiconductor layer 162 is disposed at the uppermost surface of the electrostatic capacitance detection element. With approach of the target object of which a charge is produced on the surface to the capacitance detection electrode 41M, an inversion layer (composed of a positive charge) starts to be formed on the surface of the semiconductor layer 162 in response to the charge (negative charge) produced on the surface of the target object. The closer the target object comes to the surface, the more concentration of charge (positive charge) produced in the inversion layer is increased. When a fixed amount of charge is stored, the inversion layer shows conductivity so as to flow a current to a part having lower potential. This process can be considered as the same as the principle in which upon increasing of an apply voltage to a gate electrode of a MOS transistor, an inversion layer starts to be formed in a channel region so as to flow a channel current. Once the inversion layer (If it is aimed at perfection in physical point of view, a stored layer composed of a charge having an opposite polarity to that of a charge produced on the surface of the target object) is formed on the surface of a semiconductor, the semiconductor behaves as metal. Therefore, when a discharge occurs from the surface of the target object, the discharge reaches on a metal surface. As a result, the electrostatic capacitance detection device can be prevented from a breakdown due to an electrostatic discharge.

In addition, according to the embodiment, the insulator 160 formed under the semiconductor layer 162 shows a high electrical resistance. Accordingly, even though the inversion layer is produced in the semiconductor layer 162, or the target object contacts the capacitance detection dielectric layer, a region between the semiconductor layer and the capacitance detection electrode has a high electrical resistance that substantially prevents a current from being flowed. Consequently, the current cannot directly flow via the capacitance detection electrode 41 due to the insulator 160. As a result, peripheral circuits can be prevented from the breakdown due to the electrostatic discharge.

As minutely described later, in the invention, when a ridge of a target object (e.g. ridges of a fingerprint) at the ground potential contacts the electrostatic capacitance detection device, the signal amplification element becomes off-state. When a valley of the target object (e.g. valleys of the fingerprint) comes close to the electrostatic capacitance detection device, the signal amplification element becomes on state. Similarly, potential of the capacitance detection dielectric layer 42 and charge amount induced on the surface of the capacitance detection dielectric layer 42 differ in the ridge and the valley of the target object (FIG. 4). In other words, in order to detect the electrostatic capacitance with high accuracy, surface potential VST when the ridge contacts should be different from surface potential VSV when the valley comes close. Therefore, electrical conductivity of the semiconductor layer 162 should be sort of small. For example, if a lot of currents flow between the capacitance detection electrodes due to a low resistance in the semiconductor layer 162, a charge in a region facing the valley of the fingerprint of the capacitance detection electrode 41V would move to a region facing the ridge of the fingerprint of the capacitance detection electrode 41M, resulting in a small difference in potential of the capacitance detection electrode 41 caused by the electrostatic discharge difference between the ridge and valley of the fingerprint. As a result, accuracy of fingerprint detection is lowered. Accordingly, nevertheless for preventing instantaneous current, the semiconductor layer 162 cannot be a condition in which currents too easily flow. Below, conditions required to the semiconductor layer 162 will be analyzed.

When the ridge of a fingerprint comes close to the capacitance detection dielectric layer 42, the surface potential VST and the surface charge QST become zero.

$$V_{ST} = 0$$

$$Q_{ST} = 0$$

In contrast, at a part corresponding to the valley of the fingerprint of the capacitance detection dielectric layer 42, surface potential VSV and surface charge QSV are defined by the following equation:

$$V_{SV} = \frac{C_D}{C_D + C_A} \cdot V_{GV} \qquad \text{Equation 4}$$

$$= \frac{C_D}{C_D + C_A} \cdot \frac{kC_T + C_R}{\frac{C_A C_D}{C_A + C_D} + C_T + C_R} \cdot V_{dd}$$

$$\approx \frac{C_D}{C_D + C_A} \cdot V_{dd}$$

Here, in Equation 4, k is average value of undetermined coefficient kd of drain and undetermined coefficient ks of source of the signal amplification element T1, i.e. k=(kd+ks)/2. Both kd and ks are not less than zero nor more than one. In addition, as described later, it is assumed that an element capacitance CD is sufficiently larger than the sum of a reference capacitor capacitance CR and a transistor capacitance CT, i.e. CR+CT, the reference capacitor capacitance CR is sufficiently larger than a target object capacitance CA, and the reference capacitor capacitance CR is sufficiently larger than the transistor capacitance CT. That is, the Equation 4 represents the surface potential VST when Equation 5 is satisfied.

$$C_D \gg C_T + C_R; \quad C_R \gg C_A; \quad C_R \gg C_T \qquad \text{Equation 5}$$

An electrical resistance RPP of the capacitance detection dielectric layer between the capacitance detection electrodes 41 is defined by Equation 6.

$$R_{PP} = \frac{x - y}{y \cdot t_D} \cdot \rho_D \qquad \text{Equation 6}$$

where x is a pitch between electrodes, y is a width of the electrode, tD is the thickness of the dielectric layer, and ρD is a specific resistance of the dielectric layer.

Here, the Equation 6 is modified using α≡y/x (<1). The electrical resistance RPP of the dielectric layer and the specific resistance ρD are represented by the following equation.

$$R_{PP} = \frac{1-\alpha}{\alpha} \cdot \frac{\rho_D}{t_D} \quad [\Omega] \qquad \text{Equation 7}$$

$$\rho_D = \frac{\alpha}{1-\alpha} \cdot R_{PP} \cdot t_D \quad [\Omega \cdot cm]$$

The current IPP produced between the capacitance detection electrodes 41 via the capacitance detection dielectric layer 42 is defined by the following equation.

$$I_{PP} = \frac{V_{SV} - V_{ST}}{R_{PP}} = \frac{V_{SV}}{R_{PP}} \qquad \text{Equation 8}$$

Here, when Δτ is defined as measurement time per electrostatic capacitance detection element, a surface charge amount ΔQ that moves in the measurement time Δτ is defined by the following equation.

$$\Delta Q = I_{PP} \cdot \Delta \tau = \frac{V_{SV}}{R_{PP}} \cdot \Delta \tau \qquad \text{Equation 9}$$

If the surface charge amount ΔQ is sufficiently small as compared with the surface charge amount QSV, no influence on the measurement. For example, if the surface charge amount ΔQ is approximately 10% and below of the surface charge amount QSV, no influence on the measurement. That is, this relation is represented by the following equation.

$$\Delta Q \ll Q_{SV} \quad \text{OR} \quad \Delta Q < \frac{Q_{SV}}{10} \qquad \text{Equation 10}$$

The surface charge amount QSV is represented as QSV=CA·VSV, where CA is the electrostatic capacitance of the target object (target object capacitance). Therefore, the following equation is obtained.

$$\frac{V_{SV}}{R_{PP}} \cdot \Delta \tau < \frac{C_A V_{SV}}{10} \qquad \text{Equation 11}$$

Accordingly, the electrical resistance RPP of the capacitance detection dielectric layer 42 is preferably satisfies the following equation.

$$R_{PP} > \frac{10 \cdot \Delta \tau}{C_A} \qquad \text{Equation 12}$$

Here, the equation of the electrical resistance is converted to the following equation with relation to the specific resistance ρD. This is the conditional equation with relation to the specific resistance ρD of the capacitance detection dielectric layer 42.

$$\frac{1-\alpha}{\alpha} \cdot \frac{\rho_D}{t_D} > \frac{10 \cdot \Delta\tau}{C_A} \rightarrow \rho_D > \frac{\alpha}{1-\alpha} \cdot t_D \cdot \frac{10 \cdot \Delta\tau}{C_A} \quad \text{Equation 13}$$

In the capacitance detection dielectric layer 42, the electrical resistance of the insulator 160 is substantially infinitive. Only the semiconductor layer 162 contributes the current. The thickness tD can be considered as the thickness of the semiconductor layer 162.

Consequently, if the above-mentioned conditional equation of the electrical resistance or the specific resistance is satisfied, the charge amount of the target object that flows to the adjacent capacitance detection electrode can be suppressed so as not be 10% and above within the measurement time Δ τ. As a result, the electrostatic capacitance detection device can be prevented from the breakdown due to the electrostatic discharge without lowering measurement accuracy.

Here, an impurity concentration n required to the semiconductor layer 162 will be described. In the semiconductor layer, the specific resistance ρD of the semiconductor layer is defined by the following equation.

$$\rho_D = \frac{1}{q\mu n} \quad \text{Equation 14}$$

where q is a carrier charge amount of the semiconductor layer, and μ is carrier mobility of the semiconductor layer. Thus, by modifying the conditional equation with relation to the specific resistance, the impurity (carrier) concentration n of the semiconductor layer 162 preferably satisfies the following equation.

$$n < \frac{1-\alpha}{\alpha} \cdot \frac{C_A}{10 \cdot \Delta\tau} \cdot \frac{1}{q\mu t_D} \quad \text{Equation 15}$$

The upper limit value of the impurity concentration n that should be contained in the semiconductor layer 162 is determined every electrostatic capacitance detection device using the equation. The lower limit value is an intrinsic impurity concentration contained in intrinsic semiconductor. Accordingly, the conditional equation can be deformed to the following equation.

$$\therefore n_{intrinsic} < n < \frac{1-\alpha}{\alpha} \cdot \frac{C_A}{10 \cdot \Delta\tau} \cdot \frac{1}{q\mu t_D} \quad \text{Equation 16}$$

where nintrinsic is an impurity concentration of the intrinsic semiconductor.

By controlling the impurity amount, i.e. dose amount, of the semiconductor layer so as to satisfy the condition, the charge amount of the target object that flows to the adjacent capacitance detection electrode can be suppressed so as not be 10% and above within the measurement time Δ τ. As a result, the electrostatic capacitance detection device can be prevented from the breakdown due to the electrostatic discharge without lowering measurement accuracy. The impurity concentration nintrinsic of the intrinsic semiconductor is 1.45×10¹⁰ cm−3 at room temperature.

The above-mentioned analysis shows the conditions for the capacitance detection dielectric layer 42 of the embodiment. In addition, the transistor capacitance CT and the reference capacitor capacitance CR of the semiconductor device for signal amplification, and the element capacitance CD of the signal detection element 4 should be determined so that the signal amplification element T1 of the embodiment effectively fulfils the function of signal amplification. Below, requirements for the determination will be obtained.

Figure 6:
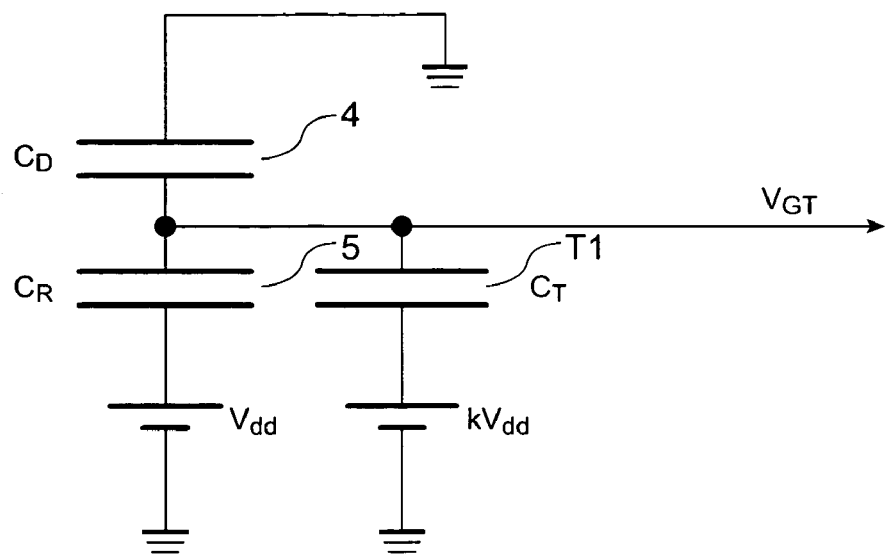
FIG. 6 is an equivalent circuit diagram of the electrostatic capacitance detection element when a convex part (ridges in a fingerprint) of a target object is contacted.
Figure 7:
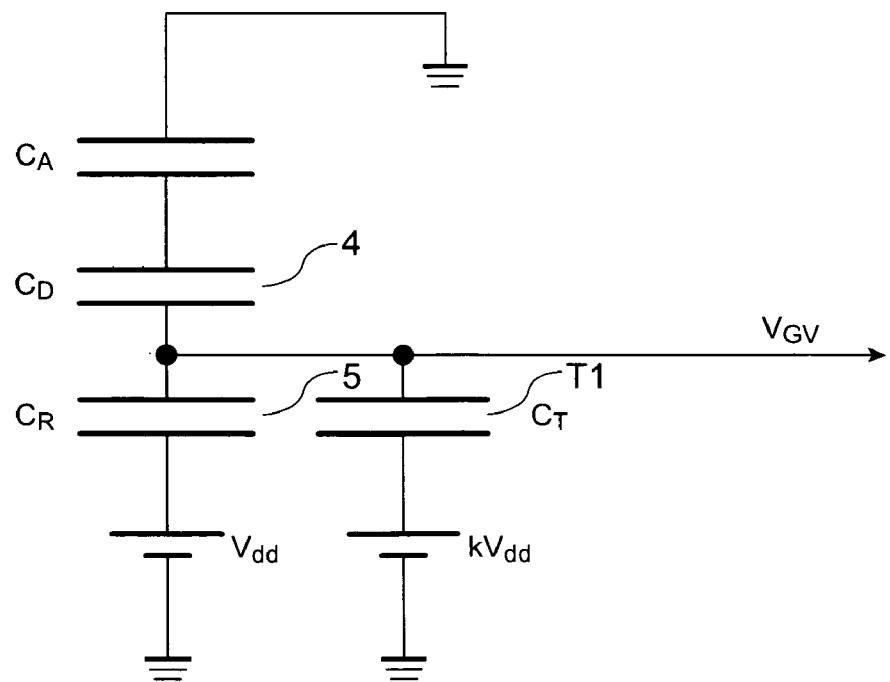
FIG. 7 is an equivalent circuit diagram of the electrostatic capacitance detection element when a concave part (valleys in a fingerprint) of the target object is approached.

With reference to equivalent circuits shown in FIG. 6 and FIG. 7, a condition in order for the electrostatic capacitance detection device effectively detects a signal will be obtained. FIG. 6 is an equivalent circuit of the electrostatic capacitance detection element 1 in a condition in which a convex part of a measurement object (e.g. ridges in a fingerprint) contacts the capacitance detection dielectric layer 42, and the object is electrically earthed. FIG. 7 is an equivalent circuit of the electrostatic capacitance detection element 1 in a condition in which a concave part of a measurement object (e.g. valleys in a fingerprint) comes close to the capacitance detection dielectric layer 42, and the object is electrically earthed.

FIG. 6 illustrates the equivalent circuit of the electrostatic capacitance detection element 1 of the embodiment shown in FIG. 1 under a condition in which the ridges in a fingertip contacts the surface of the electrostatic capacitance detection device used as a fingerprint sensor. The reference capacitor capacitance CR and the transistor capacitance CT of the signal amplification element T1 are defined by the following equations:

$$C_R = \epsilon_0 \cdot \epsilon_R \cdot S_R / t_R; \text{ and}$$

$$C_T = \epsilon_0 \cdot \epsilon_{ox} \cdot S_T / t_{ox}$$

where SR (μm2) is the area of the reference capacitor electrode 5, tR (μm) is the thickness of reference capacitor dielectric layer 52, εR is a relative dielectric constant of the reference capacitor dielectric layer 52, ST (μm2) is the area of the gate electrode of the signal amplification element T1, tox (μm) is the thickness of the gate insulator 120 of the signal amplification element T1, εox is a relative dielectric constant of the gate insulator 120, and ε0 is the permittivity in vacuum.

In addition, the element capacitance CD of the signal detection element 4 is defined by the following equation:

$$C_D^{-1} = (\epsilon_0 \cdot \epsilon_{DI} \cdot S_D / t_{DI})^{-1} + (\epsilon_0 \cdot \epsilon_{DS} \cdot S_D / t_{DS})^{-1}$$

where SD (μm2) is the area of the capacitance detection electrode 41, tDI (μm) is the thickness of the insulator 160 of the capacitance detection dielectric layer 42, tDS (μm) is the thickness of the semiconductor layer 162, εDI is a relative dielectric constant of the insulator 160 of the capacitance detection dielectric layer 42, εDS is a relative dielectric constant of the semiconductor layer 162, and ε0 is the permittivity in vacuum. As shown in the Equation 5, it is preferable that the element capacitance CD of the signal detection element 4 is sufficiently larger than the sum of the reference capacitor capacitance CR and the element capacitance CT of the signal amplification element, i.e. CR+CT. Below, it will be specifically examined.

In FIG. 6, the surface of the target object serves as the earth electrode of the element capacitance CD and the capacitance detection electrode 41 serves as the other electrode. The capacitance detection dielectric layer 42 is sandwiched between the surface of the target object and the capacitance detection electrode 41. Since the capacitance detection electrode 41 is connected to the gate electrode 170 of the signal amplification element T1 and the electrode 53 of the reference capacitor 5, the capacitor having the capacitance CD and the capacitor having the transistor capacitance CT are connected in series, and the capacitor having the capacitance CD is also connected to the capacitor having the reference capacitor capacitance CR in series. The electrode 51 of the reference capacitor 5 is connected to the row line R(i). High potential (Vdd) is applied to the electrode 51 when the row line R is selected. In a case where a positive power supply is used as the power supply, the ground potential is supplied to the power supply line P. In a case where the output line O is high potential (Vdd), the drain potential of the signal amplification element T1 is k (0<k≦1) times of Vdd when the row line R is selected. Because the signal amplification element T1 is connected to the column selection element T2 and the row selection element T3 in series, and disposed between the power supply line P and the output line O. Here, the value of k is determined by the resistance values of the column selection element T2, the row selection element T3, and the signal amplification element T1. Specifically, the value of k is not less than zero nor more than one. In a case where both the column selection element T2 and the row selection element T3 are not provided, the value of k is one.

The applied voltage to the row line R and the drain potential of the signal amplification element T1 is divided in proportion to the electrostatic capacitance of three capacitors. The voltage VGT applied to the gate electrode 170 of the signal amplification element T1 (the gate voltage when the convex part is contacted) is defined by the following equation.

$$V_{GT} = \frac{kC_T + C_r}{C_D + C_T + C_R} \cdot V_{dd} \qquad \text{Equation 17}$$

Here, k is average of the coefficient kd of the drain and the coefficient ks of the source of the signal amplification element T1, i.e. k=(kd+ks)/2. Accordingly, when the element capacitance CD is sufficiently larger than the sum of the reference capacitor capacitance CR and the transistor capacitance CT, i.e. CR+CT, the gate voltage VGT is approximated by the following equation. In other words, almost no voltage is applied to the gate electrode.

$$C_D \gg kC_T + C_R, \text{ Then } V_{GT} \approx 0 \qquad \text{Equation 18}$$

As a result, the signal amplification element T1 is in the off state, and the current I is extremely small. Ultimately, the signal amplifying element T1 should release almost no current when the ridge of a target object corresponding to the ridge of a fingerprint contacts the electrostatic capacitance detection device. Hence, in order to attain that, the area (the gate electrode length, gate electrode width) of the gate electrode 170, gate insulator material, gate insulator thickness, reference capacitor electrode area (the capacitor electrode length, capacitor electrode width), reference capacitor dielectric layer material, reference capacitor dielectric layer thickness, capacitance detection electrode area, capacitance detection dielectric layer material, and capacitance detection dielectric layer thickness must be appropriately set so that the element capacitance CD is sufficiently larger than the sum of the reference capacitor capacitance CR and the transistor capacitance CT, i.e. CR+CT.

Here, "sufficiently larger" means a difference in magnitude of about 10 times or greater. In other words, the element capacitance CD and the sum of the reference capacitor capacitance CR and the transistor capacitance CT should satisfy the following relationship:

$$C_D > 10 \times (C_R + C_T)$$

In this case, VGT/Vdd is approximately 0.1 or less, and the thin film semiconductor device cannot enter the on state.

For the ridges of a target object to be accurately detected, it is important that the signal amplification element T1 be in the off state when the ridges of the target object contact the capacitance detection dielectric layer 42 of the capacitance detection electrode 41. Therefore, if a power supply voltage is high potential (Vdd), an N-type enhancement mode transistor (normally off type), which does not release drain current at a gate voltage near zero, is preferably used as the thin film semiconductor device for signal amplification element T1. More ideal is to use an N-type MIS thin film semiconductor device for signal amplification in which the minimum gate voltage satisfies the relationship:

$$0 < 0.1 \times V_{dd} < V_{min} \text{ or } 0 < V_{GT} < V_{min}$$

where Vmin is the gate voltage (minimum gate voltage) at which the minimum drain current in transfer characteristics is reached.

In contrast, if a power supply voltage is low potential (Vss) and high potential (Vdd) is supplied as the ground potential, an P-type enhancement mode transistor (normally off type), which does not release drain current at a gate voltage near zero, is preferably used as the thin film semiconductor device for signal amplification element T1. More ideal is to use a P-type MIS thin film semiconductor device for signal amplification in which the minimum gate voltage Vmin of the P-type MIS thin film semiconductor device for signal amplification satisfies the relationship:

$$V_{min} < 0.1 \times V_{dd} < 0 \text{ or } V_{min} < V_{GT} < 0$$

Using such device enables the ridges of the target object to be accurately detected under the situation where the current value I is extremely small.

FIG. 7 illustrates the equivalent circuit of the electrostatic capacitance detection element 1 of the embodiment shown in FIG. 1 under a condition in which the valleys in a fingerprint are above the surface of the electrostatic capacitance detection device used as a fingerprint sensor. This is a situation where the target object is not in contact with but is separated from the capacitance detection dielectric layer 42 by a target object distance tA.

As shown in FIG. 4, since the surface of the target object is not in contact with the capacitance detection dielectric layer 42, a new capacitor with air as the dielectric is formed between the capacitance detection dielectric layer 42 and the target object surface.

This is called the target object capacitance CA and is defined as follows:

$$C_A = \epsilon_0 \cdot \epsilon_A \cdot S_D / t_A$$

where ϵ0 is the permittivity in vacuum, ϵA is the dielectric constant of air, and S D is the area of the capacitance detection electrode 41. Based on the above-mentioned definitions, the reason why it is preferable that the reference capacitor capacitance CR is sufficiently larger than the target object capacitance CA as shown in FIG. 5 will be described below.

As shown in FIG. 7, when such a target object is separated from the capacitance detection dielectric layer, the element capacitance CD and the target object capacitance CA are connected in series, and these capacitors are connected to the transistor capacitance CT of the signal amplification element T1 and the reference capacitor capacitance CR, both of which are connected in parallel each other, in series. The voltage Vdd is applied to the reference capacitor 5. The voltage of kVdd is applied to the drain electrode of the signal amplification element T1. The applied voltage is divided among the four capacitors in response to the electrostatic capacitance. Here, therefore, voltage VGV, (the gate voltage when the valley is present), which is applied to the gate electrode 170 of the signal amplification element T1, is as shown in Equation 19.

$$V_{GV} = \frac{kC_T + C_R}{\frac{C_A C_D}{C_A + C_D} + C_T + C_R} \cdot \qquad \text{Equation 19}$$

$$V_{dd} = \frac{V_{dd}}{\frac{C_T + C_R}{kC_T + C_R} + \frac{1}{(kC_T + C_R)/C_D + (kC_T + C_R)/C_A}}$$

On the other hand, in the invention, the electrostatic capacitance detection element 1 is formed so that the condition in Equation 5 is satisfied.

$$C_D \gg C_T + C_R;\ C_R \gg C_A;\ C_R \gg C_T \qquad \text{Equation 5}$$

This is done so that the drain current is extremely small when the target object contacts the electrostatic capacitance detection device.

VGV is approximated by Equation 20.

$$C_D \gg C_T + C_R \geq kC_T + C_R \qquad \text{Equation 20}$$

$$\text{Then, } V_{GV} \approx \frac{V_{dd}}{\frac{C_T + C_R}{kC_T + C_R} + \frac{C_A}{kC_T + C_R}}$$

Here, if the reference capacitor capacitance CR is sufficiently larger than the target object capacitance CA, the following equation is satisfied.

$$C_R \gg C_A, \text{ namely, } kC_T + C_R \gg C_A.$$

Then the gate voltage VGV is expressed by Equation 21 to be further simplified.

$$V_{GV} \approx \frac{kC_T + C_R}{C_T + C_R} \cdot V_{dd} \qquad \text{Equation 21}$$

If the value of k is nearly one, the gate voltage VGV is nearly equal to the power supply voltage Vdd. If the reference capacitor capacitance CR is sufficiently larger than the transistor capacitance CT, i.e. CR>>CT, the gate voltage VGV is expressed by Equation 22 regardless of the number of k, $$V_{GV} \approx V_{dd} \qquad \text{Equation 22}$$

and nearly equal to the power supply voltage Vdd.

As a result, the signal amplification element T1 can be put into the on state and an extremely large current I is obtained. In order for the signal amplification element T1 to conduct a large current when a valley of a target object corresponding to the valley of a fingerprint is present over the electrostatic capacitance detection device, the signal amplification element must be appropriately set so that the reference capacitor capacitance CR is sufficiently larger than the target object capacitance CA.

As stated above, since a difference in magnitude of about 10 times is generally considered sufficiently larger, the reference capacitor capacitance CR and the target object capacitance CA should satisfy the following relationship:

$$C_R > 10 \times C_A$$

In addition, in order to cause the transistor enter on state when the valley of the fingerprint or the like approaches regardless of the value of k, the reference capacitor capacitance CR may be sufficiently larger than the transistor capacitance CT as following relationship:

$$C_R > 10 \times C_T$$

If those conditions are satisfied, the VGT/Vdd is approximately 0.9 or greater, and the thin film semiconductor device included in the signal amplification element T1 easily enters the on state.

In order for a concave part of a target object to be accurately detected, it is important that the semiconductor device for signal amplification serving as the signal amplification element T1 be in the on state when the concave part of the target object approaches the electrostatic capacitance detection device. Therefore, if a positive power supply is used for the power supply voltage Vdd, an N-type enhancement mode transistor (normally off type) is used as the thin film semiconductor device for signal amplification. The threshold voltage Vth of this transistor is preferably smaller than the VGV. More ideal is to preferably use an N-type MIS thin film semiconductor device for signal amplification that satisfies the following relationship:

$$0 < V_{th} < 0.91 \times V_{dd}$$

Conversely, if a negative power supply is used for the power supply voltage Vdd, a P-type enhancement mode transistor (normally off type) is used as the thin film semiconductor device for signal amplification. Ideally, the threshold voltage Vth of the signal-amplifying P-type MIS thin film semiconductor device is preferably larger than the VGV. More ideal is to preferably use a P-type MIS thin film semiconductor device for signal amplification that satisfies the following relationship:

$$0.91 \times V_{dd} < V_{th} < 0$$

This relationship enables the concave part of the target object to be accurately detected under the situation where the current value I is extremely large.

Consequently, correct recognition of the convex parts and concave parts in the target object requires that the signal amplification element conducts almost no current when a convex part of the target object, which corresponds to a ridge in an object such as a fingerprint, contacts the electrostatic capacitance detection device. At the same time, correct recognition of the convex parts and concave parts in the target object requires that the signal amplification element conducts a large current when a concave part in the target object, which corresponds to a valley in an object such as a fingerprint, is over the electrostatic capacitance detection device. Therefore, to achieve correct recognition of the convex parts and concave parts, the capacitance detection dielectric layer 42 in the electrostatic capacitance detection element 1 must be positioned on the uppermost surface of the electrostatic capacitance detection element 1. Moreover, the gate electrode area ST (μm2), the thickness tox (μm) of the gate insulator and the relative dielectric constant εox of the gate insulator of the signal amplification element T1, the reference capacitor electrode area SR (μm2), the thickness tR (μm) of the reference capacitor dielectric layer, the relative dielectric constant εR of the reference capacitor dielectric layer, the capacitance detection electrode area SD (μm2), the thickness tD (μm) of the capacitance detection dielectric layer and the relative dielectric constant εD of the capacitance detection dielectric layer or the like must all be appropriately set so that the element capacitance CD is sufficiently larger than the sum of the reference capacitor capacitance CR and the transistor capacitance CT, namely CR+CT. Also, it is required that the electrostatic capacitance detection device be configured so that the reference capacitor capacitance CR is sufficiently larger than the target object capacitance CA when the target object is not in contact with the capacitance detection dielectric layer but is separated by the target object distance tA. Further still, it is ideal that the reference capacitor capacitance CR is sufficiently larger than the transistor capacitance CT. More specifically, the electrostatic capacitance detection device is provided so that the reference capacitor capacitance CR, and the transistor capacitance CT satisfy the following relationship:

$$C_R > 10 \times C_T$$

and the element capacitance CD, the reference capacitor capacitance CR and the target capacitance CA satisfy the following relationship:

$$C_D > 10 \times C_R; \text{ and}$$

$$C_R > 10 \times C_A$$

In addition, if high potential (Vdd) is used as the power supply voltage, an N-type enhancement mode transistor (normally off type) is preferably used as the thin film semiconductor device for signal amplification. It is ideal to use an N-type enhancement mode transistor wherein the minimum gate voltage Vmin satisfies the following relationship:

$$0 < 0.1 \times V_{dd} < V_{min} \text{ or } 0 < V_{GT} < V_{min}$$

and, moreover, wherein the threshold voltage Vth is smaller than the VGV, and, specifically, satisfies the following relationship:

$$0 < V_{th} < 0.91 \times V_{dd} \text{ or } 0 < V_{th} < V_{GV}$$

Conversely, if a negative power supply (Vss) is used for the power supply voltage, a P-type enhancement mode transistor (normally off type) is preferably used as the thin film semiconductor device for signal amplification. It is ideal to use a P-type enhancement mode transistor wherein the minimum gate voltage Vmin satisfies the following relationship:

$$V_{min} < 0.1 \times V_{dd} < 0 \text{ or } V_{min} < V_{GT} < 0$$

and, moreover, wherein the threshold voltage Vth is larger than the VGV, and, specifically, satisfies the following relationship:

$$0.91 \times V_{dd} < V_{th} < 0 \text{ or } V_{GV} < V_{th} < 0$$

EXAMPLE 1

An electrostatic capacitance detection device made up of thin film semiconductor devices was fabricated on a glass substrate. The fabricated electrostatic capacitance detection device was then transferred to a plastic substrate using known transfer technology. The circuit configuration is the same as that in the embodiment. The electrostatic capacitance detection device includes electrostatic capacitance detection elements arranged in a matrix of 304 rows and 304 columns. The array is a square, 20 mm on a side.

Below, details will be described by corresponding to the layer structure shown in FIG. 2. The substrate 100, made of poly-ether-sulfone (PES), has a thickness of 200 μm. The signal amplification element T1, the column selection element T2, and the row selection element T3 are all fabricated with N-type thin film semiconductor devices. The thin film semiconductor devices are a top-gate type, as shown in FIG. 2. They are fabricated in a low-temperature process where the maximum process temperature is 425° C. The gate electrode length L of the thin film semiconductor device for signal amplification, the thin film semiconductor device for column selection, and the thin film semiconductor device for row selection is 3 μm, while the gate electrode width W of them is 5 μm. The semiconductor layer 110, a polycrystalline silicon thin film achieved through laser crystallization, has a thickness of 50 nm. In addition, the gate insulator 120 is a silicon oxide film having a thickness of 45 nm that was formed by chemical vapor deposition (CVD). The gate electrode 170 includes a 400-nm-thick tantalum thin film. The dielectric constant of the silicon oxide film that forms the gate insulator 120 was found to be approximately 3.9 according to CV measurement. The first electrode 51 of the reference capacitor is fabricated with the N-type semiconductor layer used for the drain region of the thin film semiconductor device for signal amplification. The reference capacitor dielectric layer 52 is fabricated with the silicon oxide film used for the gate insulator of the thin film semiconductor device for signal amplification. The second electrode 53 of the reference capacitor is fabricated with the tantalum thin film used for the gate electrode of the thin film semiconductor device for signal amplification. The first electrode 51 of the reference capacitor is connected to the row line R via a contact hole. The second electrode 53 of the reference capacitor is connected to the gate electrode of the N-type thin film semiconductor device for signal amplification and the capacitance detection electrode 41.

In the example 1, the pitch x of the capacitance detection electrode 41 is 66 μm. The area SD of the capacitance detection electrode 41 is 1485 μm2. Therefore, the width y (=√SD), i.e. the length on a side of the capacitance detection electrode 41 is 38.5 μm (=√1485 μm2). The capacitance detection dielectric layer is composed of the silicon nitride film of a thickness of 230 nm and the amorphous silicon film of a thickness of 100 nm deposited on the silicon nitride film. In this case, the capacitance CDI of the silicon nitride film is as shown in Equation 23.

$$C_{DI} = \frac{\varepsilon_0 \cdot \varepsilon_{DI} \cdot S_D}{t_{DI}}$$

$$= \frac{8.85 \times 10^{-14} [F/\text{cm}] \times 7.5 \times 1485 [\mu m^2]}{0.23 [\mu m]}$$

$$= 429 [fF]$$

Equation 23

The capacitance CDS of the semiconductor layer is as shown in Equation 24.

$$C_{DS} = \frac{\varepsilon_0 \cdot \varepsilon_{DS} \cdot S_D}{t_{DS}} = \frac{8.85 \times 10^{-14}[F/\text{cm}] \times 11.9 \times 1485[\mu m^2]}{0.1[\mu m]} = 1564[fF] \quad \text{Equation 24}$$

As a result, the element capacitance CD is calculated as shown in Equation 25.

$$C_D = \left(\frac{1}{C_{DI}} + \frac{1}{C_{DS}}\right)^{-1} = 337[fF] \quad \text{Equation 25}$$

If the depth tA of the valley of a fingerprint is 50 μm, which is the thickness of an air layer of the target object capacitance CA, the capacitance CA is 0.26 fF (femtofarad) (=2.6×10−16 F). The condition for the electrical resistance RPP of the capacitance detection dielectric layer 42 is calculated as shown in Equation 26 based on Equation 12. The electrical resistance RPP is more than 4×1013 Ω. Here, it is assumed that the measurement time Δτ is one horizontal scanning period (approximately 1 ms) as the longest case.

$$R_{PP} > \frac{10 \cdot \Delta\tau}{C_A} = \frac{10 \times 10^{-3}[\text{sec}]}{2.6 \times 10^{-16}[F]} = 4 \times 10^{13}[\Omega] \quad \text{Equation 26}$$

In addition, the specific resistance ρD of the semiconductor layer 162 is calculated as shown in Equation 27 based on Equation 16.

$$\rho_D > \frac{\alpha}{1-\alpha} \cdot t_D \cdot \frac{10 \cdot \Delta\tau}{C_A} = \frac{0.8}{1.2} \times 10^{-5}[\text{cm}] \times 4 \times 10^{13}[\Omega] = 1.6 \times 10^{9}[\Omega \cdot \text{cm}] \quad \text{Equation 27}$$

Moreover, if the actual carrier charge amount q=1.6×10−19 (C) and carrier mobility μ=0.1 (cm·V−1·s−1), the impurity concentration n of the semiconductor layer 162 is calculated as shown in Equation 28 based on Equation 16. This result shows that the impurity concentration n is required within the range shown in equation 28.

$$1.45 \times 10^{10}[\text{cm}^{-3}] < n < 4.0 \times 10^{10}[\text{cm}^{-3}] \quad \text{Equation 28}$$

It was confirmed that the electrostatic capacitance detection device could reliably operate, and peripheral circuits could be prevented from being broken down by the instantaneous current by using amorphous silicon that satisfies the above-mentioned conditions when the target object is approached.

As aforementioned, in the capacitance detection dielectric layer 42, the insulator 160 was fabricated with silicon nitride film having a thickness of 230 nm, while the semiconductor layer 162 was fabricated with amorphous silicon film having a thickness of 100 nm. CV measurement showed the dielectric constant of the silicon nitride film is approximately 7.5. The dielectric constant of the amorphous silicon is approximately 11.9. Using the result, the element capacitance CD is obtained as approximately 337 fF by the above-mentioned calculation. Assuming that the electrostatic capacitance detection device of the embodiment is a fingerprint sensor, since the difference in height between the ridges and valleys in a fingerprint is approximately 50 μm, the target object capacitance CA when a valley in a fingerprint is present over the surface of the electrostatic capacitance detection device is calculated to be 0.27 fF. On the other hand, because the gate electrode length L of the MIS thin film semiconductor device for signal amplification was set to 2 μm, and the gate electrode width W was set to 2 μm, the transistor capacitance CT is approximately 3.07 fF. The electrode area SR of the reference capacitor was set to 42 μm2. As a result, the reference capacitor capacitance CR was 32 fF. Accordingly, the electrostatic capacitance detection element of the example 1 satisfies the following relationship:

$C_D > 10 \times C_R$;

$C_R > 10 \times C_T$; and $C_R > 10 \times C_A$

If the power supply voltage Vdd is 3.3V, then 0.30V is the voltage VGT applied to a gate electrode of an MIS thin film semiconductor device for signal amplification when a ridge in a fingerprint touch the surface of the electrostatic capacitance detection device, and 3.11V is the voltage VGV applied to this gate electrode when a valley in a fingerprint is present. The minimum gate voltage Vmin of the N-type MIS thin film semiconductor device for signal amplification of the embodiment is 0.35V. Since it is larger than the gate voltage VGT of 0.30V when a ridge in a fingerprint touches the surface of the electrostatic capacitance detection device, the N-type MIS thin film semiconductor device for signal amplification completely entered the off state. On the other hand, the threshold voltage Vth is 1.42V. Since it is smaller than the gate voltage VGV of 3.11V when a valley in a fingerprint is present, the N-type MIS thin film semiconductor device for signal amplification completely entered the on state. As a result, the current value that is output from a signal amplifying element when a ridge in a fingerprint touches the surface of the electrostatic capacitance detection device is, at 4.5×10−13 A, exceedingly small. Conversely, when a valley in a fingerprint is present, a large current of 2.6×10−5 A is output from the signal amplification element. Hence ridge and valley information for objects such as fingerprints was detected with high accuracy and precision.

Next, an electronic apparatus equipped with the electrostatic capacitance detection device according to the invention will now be described.

Figure 8:
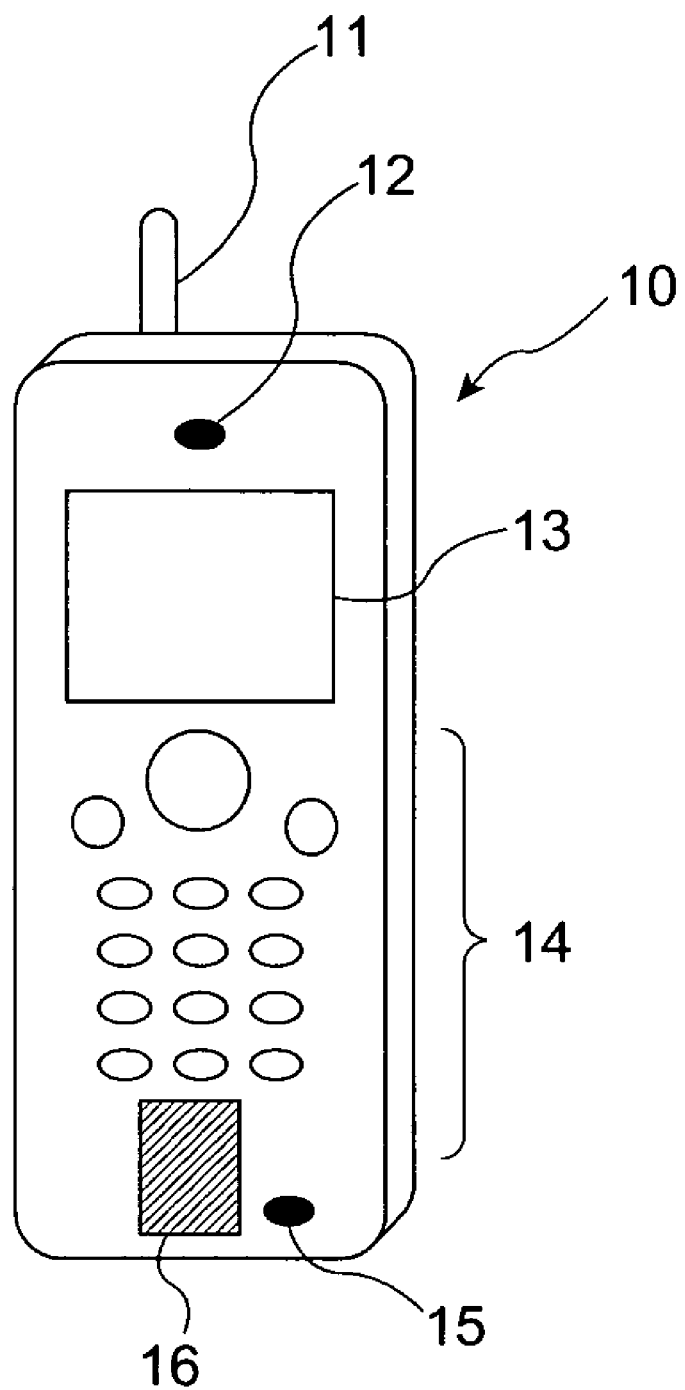
FIG. 8 illustrates an example (cellular phone) of electronic apparatuses that use the electrostatic capacitance detection device of the invention.

FIG. 8 is a schematic view illustrating a cellular phone as an example of the electronic apparatus equipped with the electrostatic capacitance detection device of the invention. A cellular phone 10 shown in FIG. 8 includes an antenna 11, a speaker 12, a display 13, operation buttons 14, a microphone 15, and an electrostatic capacitance detection device 16 of the invention.

In the cellular phone 10, the electrostatic capacitance detection device 16 functions as a fingerprint sensor for users. At the initial setting stage of the cellular phone 10, a fingerprint of an owner of the cellular phone 10 is detected by the electrostatic capacitance detection device 16 so as to store it inside the memory as on-off information of pixels for user registration. In a usage after the registration, when operation that requires a specific security procedure is done, the cellular phone 10 shows that fingerprint matching is required on the display 13 so as to encourage the user to match the fingerprint. The electrostatic capacitance detection device 16 reads a fingerprint of the user so that the cellular phone 10 checks it with the user's fingerprint registered at the initial stage by a predetermined matching method. As a result, if the newly detected fingerprint is determined as the same as that of the user, operation is permitted that requires a designated predetermined security procedure. The operation that requires such security procedure includes accessing a charged site, erasing data, displaying highly privacy invasive information, etc. The electrostatic capacitance detection device of the embodiment uses thin film semiconductor devices and has an extremely thin thickness, high durability, and high detection accuracy. As a result, it is suitable for electronic apparatuses such as cellular phones.

The electrostatic capacitance detection device of the embodiment can be further used for electronic apparatuses having a personal identity authentication function such as smart cards having the personal identity authentication function, etc.

In this way, according to the embodiment, the electrostatic capacitance detection device having high detection accuracy can be fabricated with a thin film semiconductor device. Particularly, in the embodiment, the capacitance detection dielectric layer 42 composed of the insulator 160 and the semiconductor layer 162 has the following effects.

1) According to the electrostatic capacitance detection device of the embodiment, the semiconductor layer 162 is disposed at the uppermost surface. Because of this, an inversion layer is formed on the surface of the semiconductor layer just before the target object contacts the semiconductor layer 162 so that charges of the target object quickly spreads over the surface of the semiconductor layer. As a result, circuits can be prevented from the breakdown due to the electrostatic discharge.

2) In addition, according to the electrostatic capacitance detection device of the embodiment, the insulator 160 is disposed under the capacitance detection dielectric layer 42. This configuration prevents the charges of the target object to be flowed directly via the capacitance detection electrode. As a result, circuits can be prevented from the breakdown due to the electrostatic discharge.

3) Further, a magnitude relationship among the element capacitance CD, the reference capacitor capacitance CR, and the transistor capacitance CT is set by determining conditions of electrical resistance, specific resistance, and impurity concentration that the semiconductor layer should satisfy as above-mentioned. This set relationship allows the signal amplification element T1 to differentiate the convex part and the concave part of the target object. As described in detail above, with the technology of the prior art, which uses a single-crystal silicon wafer, only small electrostatic capacitance detection devices measuring approximately several millimeters by several millimeters can be formed on a plastic substrate. According to the electrostatic capacitance detection device of the embodiment, however, an electrostatic capacitance detection device having an area some 100 times larger can be formed on a plastic substrate, and, moreover, is capable of extremely high-accuracy detection of the convex and concave information in a target object.

The embodiment can be used, for example, to markedly improve the security level of electronic apparatuses such smart cards. In addition, a conventional electrostatic capacitance detection device formed on a single-crystal silicon wafer wastes a tremendous amount of energy and labor, because only an extremely small portion of the device area actually uses the single-crystal silicon semiconductor. In contrast to this, the present invention eliminates this kind of extravagant waste and has the effect of helping conserve the global environment.

What is claimed is:

1. An electrostatic capacitance detection device comprising:
   an electrostatic capacitance detection element arranged in M rows and N columns, including:
   a signal detection element that retains a charge in proportion to the electrostatic capacitance, the signal detection element including:
   a capacitance detection electrode; and
   a capacitance detection dielectric layer formed on the capacitance detection electrode, the capacitance detection dielectric layer including:
   a first semiconductor layer; and
   an insulator disposed between the capacitance detection electrode and the first semiconductor layer; and
   a signal amplification element that amplifies a signal corresponding to the retained charge in the signal detection element, the signal amplification element including a second semiconductor layer different from the first semiconductor layer; and
   a power supply line supplying a power source to the electrostatic capacitance detection elements,
   wherein the capacitance detection dielectric layer is located on an exrosed surface of the electrostatic capacitance detection element.

2. The electrostatic capacitance detection device according to claim 1, the first semiconductor layer being disposed at an uppermost surface of the electrostatic capacitance detection element.

3. The electrostatic capacitance detection device according to claim 1, wherein an electrical resistance $R_{PP}$ of the first semiconductor layer is represented by the equation:

$$R_{PP} > \frac{10 \cdot \Delta\tau}{C_A}$$

where $\Delta\tau$ is measurement time of the electrostatic capacitance detection element, and $C_A$ is a target object electrostatic capacitance.

4. The electrostatic capacitance detection device according to claim 1, wherein a specific resistance $\rho D$ of the first semiconductor layer satisfies the equation:

$$\rho_D > \frac{\alpha}{1-\alpha} \cdot t_D \cdot \frac{10 \cdot \Delta\tau}{C_A}$$

where $\Delta\tau$ is the measurement time of the electrostatic capacitance detection element, $C_A$ is the target object electrostatic capacitance, $t_d$ is a thickness of the first semiconductor layer, and $\alpha = y/x$, wherein x is a pitch of the capacitance detection electrode, and y is a width of the capacitance detection electrode.

5. The electrostatic capacitance detection device according to claim 1, wherein an impurity concentration n of the first semiconductor layer satisfies the equation:

$$n < \frac{1-\alpha}{\alpha} \cdot \frac{C_A}{10 \cdot \Delta\tau} \cdot \frac{1}{q\mu t_D}$$

where $\Delta\tau$ is the measurement time of the electrostatic capacitance detection element, $C_A$ is the target object electrostatic capacitance, $t_D$ is the thickness of the first semiconductor layer, q is a carrier charge amount of the first semiconductor layer, $\mu$ is carrier mobility of the first semiconductor layer, and $\alpha=y/x$, wherein x is the pitch of the capacitance detection electrode, and y is the width of the capacitance detection electrode.

6. The electrostatic capacitance detection device according to claim 1, the first semiconductor layer being amorphous silicon.

7. The electrostatic capacitance detection device according to claim 6, the amorphous silicon being substantially intrinsic.

8. The electrostatic capacitance detection device according to claim 6, the amorphous silicon having a carrier concentration of $4\times10^{10}$ cm$^{-3}$ and below.

9. The electrostatic capacitance detection device according to claim 1, the insulator being silicon nitride.

10. The electrostatic capacitance detection device according to claim 1 further including a reference capacitor connected to the electrostatic capacitance detection element, wherein an element capacitance $C_D$ of the signal detection element is sufficiently larger than a sum of a reference capacitor capacitance $C_R$ and an element capacitance $C_T$ of the signal amplification element, when the reference capacitor capacitance $C_R$ and the transistor capacitance $C_t$ of the signal amplification element are defined by the following equations:

$C_R = \epsilon_0 \cdot \epsilon_R \cdot S_R / t_R$; and $C_T = \epsilon_0 \cdot \epsilon_{Ox} \cdot S_T / t_{Ox}$, where $S_R$ is of the reference capacitor electrode $t_R$ is a thickness of reference capacitor dielectric layer, $\epsilon_R$ is a relative dielectric constant of the reference capacitor dielectric layer, $S_T$ is an area of a gate electrode of the signal amplification element $t_{Ox}$ is a thickness of a gate insulator of the signal amplification element, $\epsilon_{Ox}$ is a relative dielectric constant of a gate insulator of the signal amplification element, and $\epsilon_0$ is a permittivity in vacuum, and when the element capacitance CD of the signal detection element is defined by the following equation:

$C_D^{-1} = (\epsilon_0 \cdot \epsilon_{DI} \cdot S_D / t_{DI})^{-1} + (\epsilon_0 \cdot \epsilon_{DS} \cdot S_D / t_{DS})^{-1}$ where $S_D$ is an area of the capacitance detection electrode, $t_{DI}$ is a thickness of an insulator of the capacitance detection dielectric layer, $t_{DS}$ is a thickness of the semiconductor layer of the capacitance detection dielectric layer, $\epsilon_{DI}$ is a relative dielectric constant of the insulator of the capacitance detection dielectric layer, $\epsilon_0$ is a relative dielectric constant of the semiconductor layer of the capacitance detection dielectric layer, and $\epsilon_0$ is a permittivity in vacuum.

11. The electrostatic capacitance detection device according to claim 10, wherein the target object is not in contact with but is separated from the semiconductor layer by a target object distance $t_A$ and the reference capacitator $C_R$ is sufficiently larger than a target object capacitance $C_A$, when the target object capacitance $C_A$ is defined by the equation:

$C_A = \epsilon_0 \cdot \epsilon_A \cdot S_D / t_A$ where $\epsilon_0$ is the permittivity in vacuum, $\epsilon_A$ is a relative dielectric constant of air, $S_D$ is the area of the capacitance detecting electrode.

12. The electrostatic capacitance detection device according to claim 10, wherein the target object is not in contact with but is separated from the capacitance detection dielectric layer by a target object distance $t_A$ and the reference capacitor capacitance $C_R$ is sufficiently larger than a target object capacitance $C_A$, when the target object capacitance $C_A$ is defined by the equation:

$C_A = \epsilon_0 \cdot \epsilon_A \cdot S_D / t_A$ where $\epsilon_0$ is the permittivity in vacuum, $\epsilon_A$ is a relative dielectric constant of air, $S_D$ is the area of the capacitance detecting electrode.

* * * * *

UNITED STATES PATENT AND TRADEMARK OFFICE
CERTIFICATE OF CORRECTION

PATENT NO. : 7,208,961 B2
APPLICATION NO. : 11/208585
DATED : April 24, 2007
INVENTOR(S) : Mitsutoshi Miyasaka It is certified that error appears in the above-identified patent and that said Letters Patent is hereby corrected as shown below:

Column 17, Lines 39-40 " $V_{GT} = \dfrac{kC_T + C_r}{C_D + C_T + C_R} \bullet V_{dd}$ Equation 17 " should be -- $V_{GT} = \dfrac{kC_T + C_R}{C_D + C_T + C_R} \bullet V_{dd}$ Equation 17 --

Column 26, Line 31, Claim 1: "exrosed" should be --exposed--

Column 27, Line 34, Claim 10: "$C_t$" should be --$C_T$--

Column 27, Line 39, Claim 10: after "is" insert --an area--

Column 28, Line 15, Claim 10: "$\epsilon_O$" should be --$\epsilon_{DS}$--

Column 28, Line 21, Claim 11: "capacitator" should be --capacitor capacitance--

Signed and Sealed this

Twenty-seventh Day of July, 2010

David J. Kappos
*Director of the United States Patent and Trademark Office*